(12) United States Patent
Thompson et al.

(10) Patent No.: US 12,114,552 B2
(45) Date of Patent: *Oct. 8, 2024

(54) ORGANIC ELECTROLUMINESCENT DEVICES

(71) Applicant: Universal Display Corporation, Ewing, NJ (US)

(72) Inventors: Nicholas J. Thompson, New Hope, PA (US); Michael Stuart Weaver, Princeton, NJ (US); Michael Fusella, Lawrenceville, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/131,402

(22) Filed: Apr. 6, 2023

(65) Prior Publication Data
US 2023/0284498 A1    Sep. 7, 2023

Related U.S. Application Data

(63) Continuation of application No. 17/336,622, filed on Jun. 2, 2021, now Pat. No. 11,653,543, which is a
(Continued)

(51) Int. Cl.
*H10K 59/32*    (2023.01)
*H10K 50/13*    (2023.01)
(Continued)

(52) U.S. Cl.
CPC ............. *H10K 59/32* (2023.02); *H10K 50/13* (2023.02); *H10K 50/852* (2023.02); *H10K 59/38* (2023.02); *H10K 2102/331* (2023.02)

(58) Field of Classification Search
CPC . H01L 27/3209; H01L 27/322; H01L 51/504; H01L 51/5265; H01L 2251/5369
See application file for complete search history.

(56) References Cited

U.S. PATENT DOCUMENTS

| | | |
|---|---|---|
| 4,769,292 A | 9/1988 | Tang |
| 5,247,190 A | 9/1993 | Friend |

(Continued)

FOREIGN PATENT DOCUMENTS

| | | |
|---|---|---|
| CN | 101752509 A | 6/2010 |
| CN | 106549108 A | 3/2017 |

(Continued)

OTHER PUBLICATIONS

Chinese Office Action issued in App. No. CN202010171904, dated Nov. 30, 2023, 8 pages.

(Continued)

*Primary Examiner* — Fernando L Toledo
*Assistant Examiner* — Neil R Prasad
(74) *Attorney, Agent, or Firm* — Butzel Long (57) ABSTRACT

Device structures are provided that include one or more plasmonic OLEDs and zero or more non-plasmonic OLEDs. Each plasmonic OLED includes an enhancement layer that includes a plasmonic material which exhibits surface plasmon resonance that non-radiatively couples to an organic emissive material and transfers excited state energy from the emissive material to a non-radiative mode of surface plasmon polaritons in the plasmonic OLED.

21 Claims, 6 Drawing Sheets

Related U.S. Application Data continuation of application No. 16/814,763, filed on Mar. 10, 2020, now Pat. No. 11,056,540.

(60) Provisional application No. 62/839,855, filed on Apr. 29, 2019, provisional application No. 62/817,436, filed on Mar. 12, 2019.

(51) Int. Cl.
*H10K 50/852* (2023.01)
*H10K 59/38* (2023.01)
*H10K 102/00* (2023.01)

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 6,670,772 B1 | 12/2003 | Arnold |
| 7,279,704 B2 | 10/2007 | Walters |
| 7,431,968 B1 | 10/2008 | Shtein |
| 7,968,146 B2 | 6/2011 | Wagner |
| 9,941,483 B2 | 4/2018 | Kawata |
| 9,960,386 B2 | 5/2018 | Thompson |
| 11,056,540 B2 * | 7/2021 | Thompson ............. H10K 50/19 |
| 11,653,543 B2 * | 5/2023 | Thompson ............. H10K 50/19 257/40 |
| 2003/0230980 A1 | 12/2003 | Forrest |
| 2004/0174116 A1 | 9/2004 | Lu |
| 2009/0121619 A1 | 5/2009 | Rajan |
| 2011/0248249 A1 | 10/2011 | Forrest |
| 2014/0084269 A1 | 3/2014 | Weaver |
| 2017/0133631 A1 | 5/2017 | Thompson |
| 2017/0229663 A1 | 8/2017 | Tsai |
| 2018/0175319 A1 | 6/2018 | Thompson |
| 2019/0181349 A1 | 6/2019 | Xia |
| 2019/0181370 A1 | 6/2019 | Margulies |
| 2020/0020877 A1 | 1/2020 | Thompson |

FOREIGN PATENT DOCUMENTS

| | | |
|---|---|---|
| CN | 106558652 A | 4/2017 |
| CN | 108649130 A | 10/2018 |
| CN | 109037462 A | 12/2018 |
| WO | 2008057394 A1 | 5/2008 |
| WO | 2010011390 A2 | 1/2010 |
| WO | 2016014983 A1 | 1/2016 |

OTHER PUBLICATIONS

Baldo et al. "Highly efficient phosphorescent emission from organic electroluminescent devices", Nature, vol. 395, pp. 151-154, 1998.

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Notice of Allowance dated Mar. 17, 2021 for U.S. Appl. No. 16/814,763 (pp. 1-5).

* cited by examiner

ORGANIC ELECTROLUMINESCENT DEVICES

CROSS-REFERENCE TO RELATED APPLICATIONS

This application is a non-provisional of, and claims the priority benefit of U.S. Provisional Patent Application Serial Nos. 62/817,436, filed Mar. 12, 2019 and 62/839,855, filed Apr. 29, 2019, the entire contents of each of which are incorporated herein by reference.

FIELD

The present invention relates to structures and components suitable for use in organic light emitting diodes (OLEDs) and devices including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

As used herein, a "red" sub-pixel, layer, material, region, or device refers to one that emits light in the range of about 580-700 nm; a "green" sub-pixel layer, material, region, or device refers to one that has an emission spectrum with a peak wavelength in the range of about 500-600 nm; a "blue" sub-pixel layer, material, or device refers to one that has an emission spectrum with a peak wavelength in the range of about 400-500 nm; and a "yellow" sub-pixel, layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general there are two classes of color altering layers: color filters that modify a spectrum by removing unwanted wavelengths of light, and color changing layers that convert photons of higher energy to lower energy.

As used herein, a "full-color" device, pixel, or other component refers to one that includes red, green, and blue components, and which is capable of being configured to emit a range of light across the visible spectrum. A "full-color" device may include multiple sub-pixels, each of which may be configured to emit one or more colors of light. For example, a full-color pixel may include one or more red, green, blue, and/or yellow sub-pixels, each of which emits the corresponding light. For example, a red sub-pixel may emit red light as previously defined, which, in conjunction with the other sub-pixels, allows the pixel to be a full-color pixel. Full-color pixels or other components typically also may be capable of emitting white light, such as by activating multiple colors of sub-pixels concurrently. In some cases, a full-color pixel also may include a white or other multi-color sub-pixel or similar component.

In contrast to a full-color device, pixel, or other component, a "single-color" sub-pixel or other component does not include multiple components of different colors and typically emits light only within a single color range. For example, a red single-color sub-pixel typically emits light within the red visible spectrum, i.e., 580-700 nm. A single-color sub-pixel will emit all, or essentially all, visible light emitted by the sub-pixel within the associated spectrum range. That is, while a very small amount of energy emitted by a single-color sub-pixel within the visible spectrum may fall outside the associated color range, it will be a sufficiently small amount that the difference in color is not noticeable to the human eye.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

BRIEF DESCRIPTION OF THE DRAWINGS

FIGS. 4A-4D show examples of specific OLED architectures according to the general structure shown in FIG. 3 as disclosed herein.

FIGS. 5A-5D show schematic depictions of device architectures where the plasmonic OLED features broad band emission according to embodiments disclosed herein.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
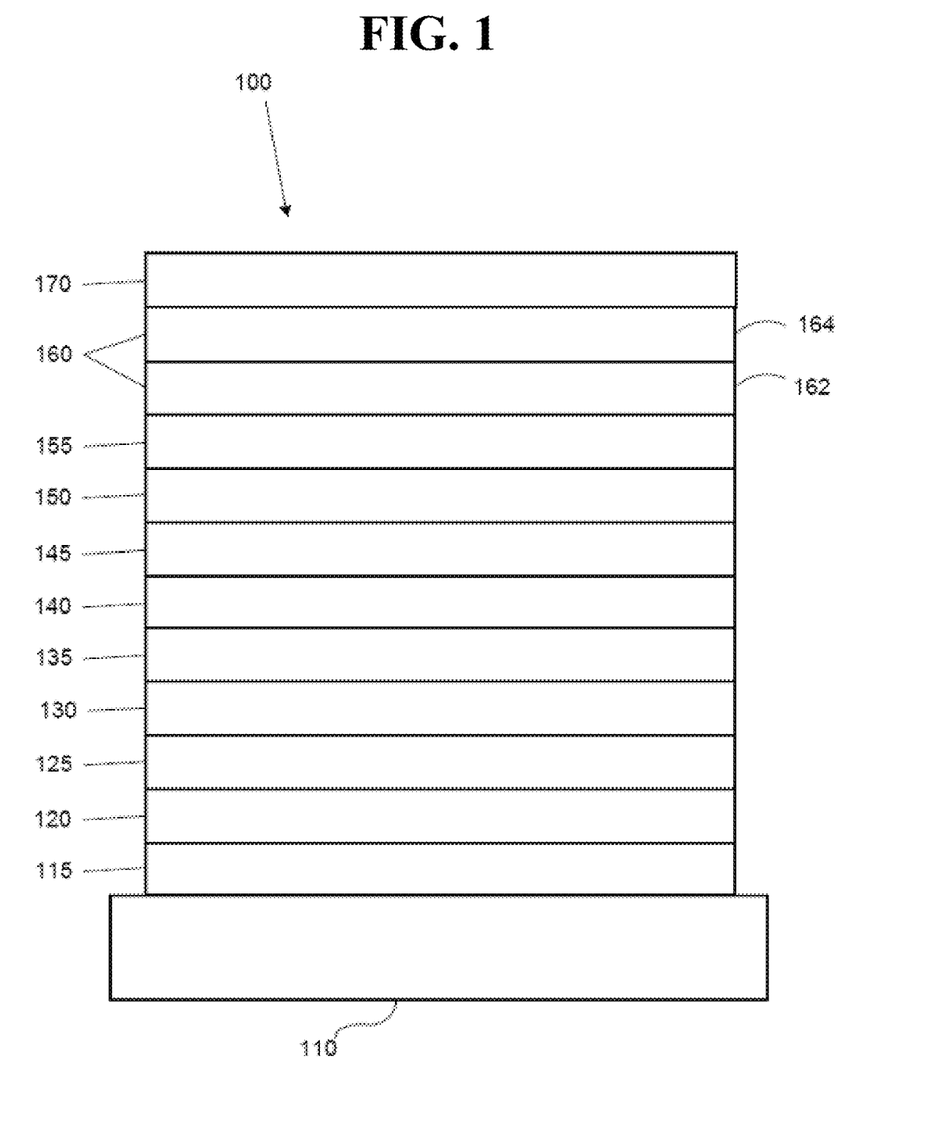
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
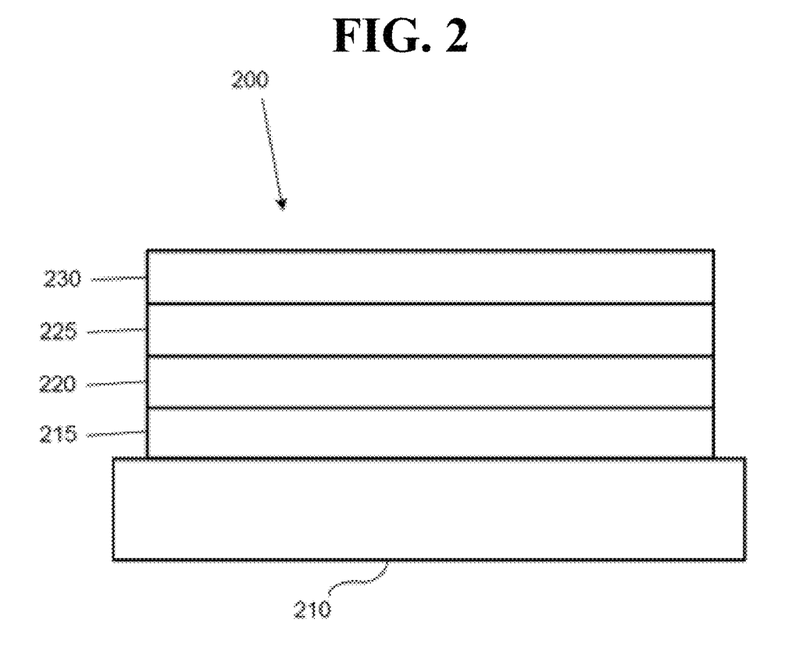
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al. which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146. PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

When an emissive material such as the emitters disclosed herein is placed in an environment with an increased density of photonic states relative to vacuum, the emission rate of the material typically increases due to a phenomenon known as the Purcell effect. The enhanced radiative and non-radiative rates decrease the length of time the emitter stays in the excited state, thereby stabilizing the emitter and reducing the aging rate of the emissive material and, as a result, the OLED device as a whole. It is believed that obtaining relatively large Purcell enhancements typically requires placing the emissive material close to a metal film or other plasmonically-active enhancement layer. Such configurations are described, for example, in U.S. Pat. No. 9,960,386, the disclosure of which is incorporated by reference in its entirety. As used herein, a "plasmonic OLED" refers to an OLED that includes an enhancement layer that includes a plasmonic material which exhibits surface plasmon resonance that non-radiatively couples to an organic emissive material in the OLED, and transfers excited state energy from the emissive material to non-radiative mode of surface plasmon polaritons. The he enhancement layer typically is provided no more than a threshold distance away from the second organic emissive layer as previously disclosed and defined. Such arrangements may be most important for emissive materials within a threshold distance of the enhancement layer, where the relevant threshold distance may be defined as the distance from the enhancement layer at which the total radiative decay rate constant is equal to the total non-radiative decay rate constant. Typically the energy coupled into the enhancement layer is lost as heat unless the device also incorporates an outcoupling layer. Embodiments disclosed herein provide techniques and arrangements that allow for the enhancement layer and/or an outcoupling layer to be incorporated into OLED displays and other devices.

Typical manufacturing methods for OLED displays usually involve patterning of the sub-pixels by controlling the materials deposited on the display for each sub-pixel (often referred to as side-by-side fabrication), or depositing a uniform OLED stack over the entire back plane and then later patterning the sub-pixels with elements such as color filters or down conversion layers. A uniform OLED stack often includes one or more blanket OLED depositions that are deposited across one or more underlying electrodes without interruption. These approaches also may be combined in various forms. Examples of these and related fabrication techniques and device arrangements are described, for example, in U.S. Pat. Nos. 9,385,168, 9,590, 017, 9,424,772, 10,243,023, 10,304,906, and 10,229,956 and U.S. Pub. Nos. 2015/0349034 and 2015/0349032, the disclosure of each of which is incorporated by reference in its entirety.

OLED displays which have a uniform OLED stack over the entire back plane often have stacked OLED devices in them. For example, current TV architectures often use 3 OLEDs stacked in series to provide a white-emitting device. From the uniform white stacked OLED deposition, 4 sub-pixels are then patterned—a red sub-pixel, a green sub-pixel, a blue sub-pixel, and a white sub-pixel, for example by using masks, color altering layers such as color filters, and the like. As another example, blue OLED devices may be stacked to generate very bright blue light which may be converted to red and/or green sub-pixels by down conversion layers disposed in a stack with the blue device, thereby rendering a display with red (R), green (G), and blue (B) (RGB) sub-pixels. Embodiments disclosed herein provide methods and arrangements to achieve a plasmonic OLED incorporated with such devices to utilize the enhancement in lifetime of the plasmonic OLED in combination with the stacked structures to benefit displays in a number of ways.

Figure 3:
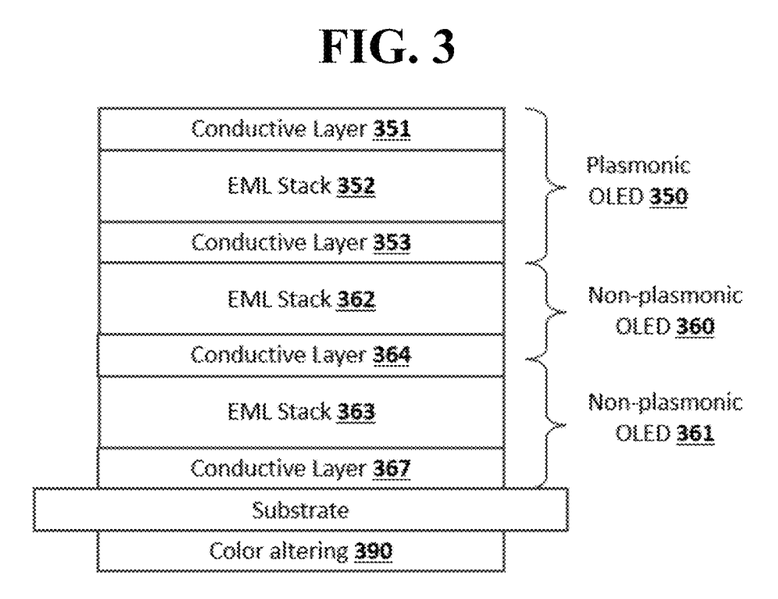
FIG. 3 shows a schematic illustration of a device including a plasmonic OLED according to an embodiment disclosed herein.

FIG. 3 shows a schematic representation of the basic structure of a device as provided herein. The device includes a plasmonic OLED 350 and zero or more, typically one or more, non-plasmonic OLEDs 360, 361. As used herein, a "non-plasmonic" OLED may be an OLED such as described with respect to FIGS. 1 and 2, or any other OLED device that does not restrict the arrangement of components in the device to meet the requirements defined for an "enhancement layer" as described herein. The plasmonic OLED 350 is provided by an emissive stack that includes outer conductive layers 351, 353 with an emissive stack 352 disposed between them. As used herein, an "emissive stack" refers to a stack of layers or other components that provide at least the minimum layers and components to emit light, typically including conductive layers and at least an emissive layer disposed between them. Each "emissive stack" 352, 362, 363 may also include any or all of the other organic and other layers disclosed herein, such as with reference to FIGS. 1 and 2, including but not limited to blocking layers, transport layers, spacing layers, and the like. In a common device structure the outer-most conductive layers 351, 367 are electrodes. An "emissive stack" in conjunction with the surrounding conductive layers provides a functional OLED device, even if it is contained within a larger device as shown, which may include multiple OLEDs, each having a corresponding emissive stack. Each of the conductive layers 351, 353 may be an electrode that includes an electrical connection that extends externally to the device, or a charge generating layer that does not include an external connection but provides the same functionality as an electrode. i.e., generation of charges within the OLED. Similarly, non-plasmonic OLEDs 360, 361 are each defined by outer conductive layers and an emissive stack between them. The first non-plasmonic OLED 360 includes an emissive stack 362 disposed between the outer conductive layers 353, 364, and the second non-plasmonic OLED includes an emissive stack 363 disposed between outer conductive layers 364, 367. As with the plasmonic OLED 350, each of the conductive layers 353, 364, 367 may be an electrode or an internal charge generation layer. Conductive layers may be shared between two adjacent emissive stacks. In this example, the conductive layer 353 may be a charge generation layer that provides electrode-like functionality to the emissive stack 352 of the plasmonic OLED 350 as well as the emissive stack 362 of the adjacent non-plasmonic OLED 360. One or more of the conductive layers 351, 353, 364, 367 may function as an enhancement layer for a plasmonic OLED in the device, such as OLED 350. In this example structure, the conductive layer 351 may be an electrode that is also the enhancement layer for the plasmonic OLED 350. Each of the devices may be described as a "stack", and the devices as a whole may be described as being arranged in a "stacked configuration" since they at least partially overlap one another vertically (i.e., in a direction from the lower-most conductive layer 367 to the upper conductive layer 351). Generally the outer-most conductive layers 351, 367 will be electrodes for the stacked device. Typically the conductive layer 367 closest to the substrate is an anode and the upper layer 351 is a cathode, but inverted arrangements may be used in which the lower layer 367 is the cathode for the device. Internal conductive layers such as layers 353, 364 typically are charge generation layers that are disposed between emissive layers of each of the OLEDs, and, more specifically, between the emissive stacks 352, 362, 363 that include one or more emissive layers and any other layers in each OLED. Other layers and components may be disposed above the conductive layer 351, such as outcoupling layers, color filters, down conversion layers, and the like. Furthermore, one or more additional layers 390 may be disposed below the substrate. i.e., opposite the substrate from the emissive stacks 350, 360, 361 or, more generally, on an opposite side of a substrate from one or more emissive layers in any of the structures disclosed herein. Such layers 390 may include, for example, one or more outcoupling layers, color filters, down conversion layers, up conversion layers, radiation pattern modifying elements, or any other color altering or similar layer as disclosed herein, including any of the materials or structures as disclosed herein for use in such layers. Examples of such structures are described in further detail herein, any of which may be used for the additional layer or layers 390 as shown. For example, any of the layers and structures shown herein, including but not limited to layers and components 305, 370, 365, 375, 565, 566, 567, 571, 572, 573, and combinations and variations thereof.

As disclosed in further detail herein with respect to example arrangements of the basic architecture shown in FIG. 3, devices provided herein may include various components and layers that operate as part of, or in conjunction with, one or more plasmonic and/or non-plasmonic OLEDs in a stacked device. Various features of these components will now be described. Unless specifically indicated to the contrary or prohibited by the physical requirements or constraints of individual features, each feature may be used in conjunction with each other feature without departing from the scope and content of the present disclosure. In addition, unless explicitly described to the contrary, any of the devices and arrangements disclosed herein, whether plasmonic or non-plasmonic OLEDs, may include any or all of the layers and structures described with respect to FIGS. 1 and 2, including but not limited to emissive layers, transport layers, blocking layers, color altering layers such as color filters, up- or down-conversion layers, quantum dot structures, charge generating layers, electrodes, and substrates.

An outcoupling layer or component as disclosed herein may be periodic, quasi-periodic, or have no periodicity, including a random physical arrangement. It may include dielectric materials, metals, or semiconducting materials or combinations of these materials. In some configurations an outcoupling layer may include an additional coating to change the radiation pattern, as described herein with respect to a radiation pattern changing element. Alternatively or in addition, an outcoupling layer may have a coating to lower the reflectivity of the layer or the device as a whole.

Each emissive layer (EML) disclosed herein, whether incorporated into a plasmonic OLED emissive stack or a non-plasmonic OLED emissive stack, may include one or more or more emissive materials. Each emissive material may emit monochromatic or multi-colored light, examples of which include, but are not limited to, red and green emissive materials to provide yellow emission, blue and red emissive materials to provide white emission, blue and red and green to make white emission, or blue, red, green and/or yellow to provide white emission. Similarly, each emissive stack may include multiple separate emissive layers to achieve the same effects. Each emissive material may be fluorescent, phosphorescent, or thermally activated delayed fluorescent (TADF) materials or combinations of these types of materials. Similarly, each emissive stack in each device disclosed herein may use any combination of fluorescent, phosphorescent, and/or TADF materials.

Each OLED and each OLED stack that includes multiple OLEDS may be a bottom-emitting, top-emitting, or two-sided device. A bottom-emitting device is one that emits through the substrate on which the device is stacked, whereas a top-emitting device emits light primarily through the opposite side of the device. A two-sided device emits through both surfaces of the OLED or device. These devices may be used in any combination within any individual device. For example, a top-most emissive stack may be top-emitting, while stacks lower in the device (i.e., closer to the substrate) may have two-sided emission. Various reflective and transmissive materials and layers may be used to achieve any desired type of emission, as is understood in the art with respect to conventional OLED structures. In some cases, the arrangement of emissive stacks and devices may be inverted from the examples shown in FIGS. 3-5. For example, for a bottom-emitting device, a plasmonic OLED may be arranged closer to the substrate with one or more non-plasmonic OLEDs stacked above it, and any outcoupling layer or component may be arranged below the anode instead of above it where the anode acts as the enhancement layer for the plasmonic OLED. Alternatively or in addition, in some configurations the electrodes may be inverted from the examples shown, such that the cathode is located below the emissive stacks and the anode is the upper-most conductive layer.

Each down conversion layer or component as disclosed herein may include one or more materials, including fluorescent emitters, inorganic phosphors, organic phosphors, and/or quantum dots. More generally, a down conversion layer or component may include any material that absorbs photons and re-emits photons at a lower energy than was absorbed by the material. Down conversion layers may be blanket layers that extend unbroken across multiple sub-pixels, or they may be patterned over only one or more sub-pixels within a device.

A plasmonic outcoupling layer as disclosed herein, such as layers 305, 571, 572, and 573 may include a variety of structures. Examples of suitable outcoupling structures include, but are not limited to, gratings or corrugation, nanopatch antennas or other nanoparticle-based outcoupling schemes, and through-hole arrays. Alternatively or in addition an outcoupling layer may include a voltage-tunable refractive index material, which may be used in conjunction with another electrode which allows for tuning of the outcoupling color based on an external voltage. Alternatively or in addition to these outcoupling structures, some devices may include conventional outcoupling structures such as microlens sheets, outcoupling grids or lenses, or the like.

Each charge generation layer disclosed herein may include metallic materials and any other material or structure known in the art for charge generation in conventional OLEDs. Alternatively or in addition, a charge generation layer may include other components such as, but not limited to, spun-on nanoparticles, nanoparticles made by growing a metal slowly so that it de-wets, or by laminating a metal film. Laminated CGLs structures may include arrays of particles, pseudo-periodic and randomly oriented nanoparticles, and through-hole arrays of a metal or a metal alloy. A CGL may be composed of a single component or it may include a mixed layer of organic material which has dielectric or metal nanoparticles embedded in it, or it may include sub-layers in any combination of these materials.

A radiation pattern modifying element as disclosed herein may converts a radiation pattern from non-Lambertian to Lambertian, or from Lambertian to non-Lambertian (such as for applications where a certain angular dependence is desired), or more generally alters the angular dependence of an attribute of light emitted by a device. Examples of components that may be used to provide a radiation pattern modifying element include nanopatch antennas and components including an equivalent nanopatch structure, semi-transparent metals, and distributed Bragg reflectors Each stacked device including multiple emissive stacks, and each individual emissive stack, may emit any desired color of light. For example, a plasmonic or non-plasmonic OLED may emit red, green, blue, yellow, white, or any other desired color. Light emitted by an emissive stack within a stacked device may be emitted by the device unchanged, or it may be changed through the use of color filters, down conversion layers, up conversion layers, and other structures as disclosed herein to achieve a desired emission spectrum for the device. A stacked device may provide a single sub-pixel within a pixel structure of a display panel, or a single stacked device structure may provide multiple sub-pixels as disclosed in various examples herein and as generally known in the art with respect to conventional stacked devices. In some cases it may be preferred for a plasmonic OLED as disclosed herein to emit blue light and/or to include a blue emissive material in the emissive layer, since blue-emitting devices typically are the limiting factor for device lifetime. Display panels using the device structures disclosed herein may include any desired combination of colors of sub-pixels, including 3- and 4-sub-pixel arrangements, white sub-pixels, red-green-blue (RGB) side-by-side arrangements, arrangements including two blue sub-pixels (RGB1B2-type devices). Devices may include a limited number of colors of emissive materials, such as where only two or three colors of emissive materials are used and color altering layers and components are used to provide other colors in a full-color pixel.

Specific examples of arrangements having the basic structure shown in FIG. 3 will now be described with respect to FIGS. 4-5. Any of the specific features, components, and layers shown in FIGS. 4-5 may be used in conjunction with any other features, components, and layers unless specifically indicated to the contrary, or unless such combination is physically prohibited based on the description and requirements of each. Furthermore, additional layers and components may be used in any of the devices shown in FIGS. 4-5, including but not limited to one or more additional layers disposed on an opposite side of a substrate from one or more emissive stacks, as described with respect to FIG. 3.

Figure 4A:
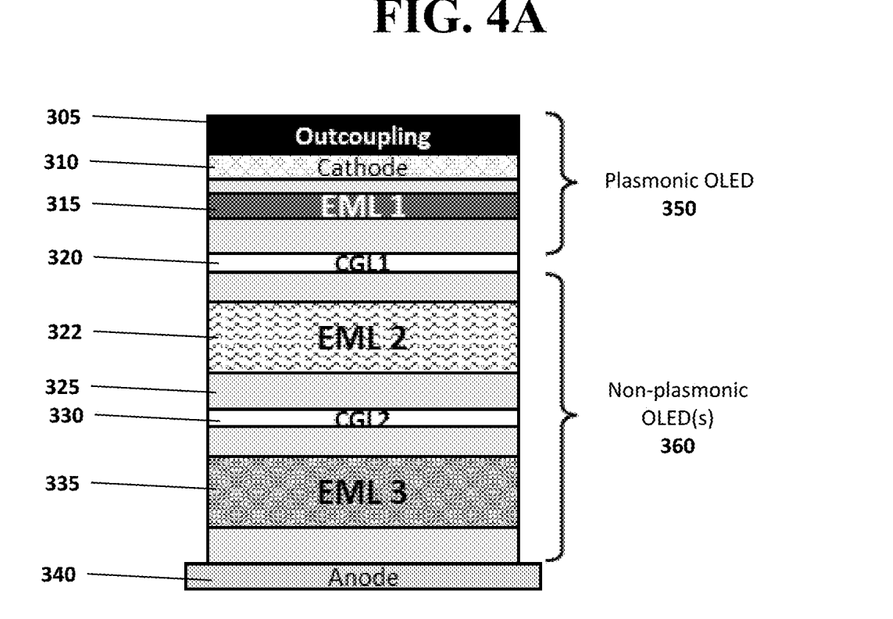
FIG. 4A shows an OLED architecture including one plasmonic OLED and two non-plasmonic OLED devices arranged in a stack and connected in series.

FIG. 4A shows a schematic illustration of a plasmonic OLED that is stacked in series with one or more non-plasmonic OLEDs as disclosed herein. As shown, a device as provided herein may include a non-plasmonic OLED structure 360, which includes outer electrodes 330, 340 with one or more layer 335 disposed between them. The non-plasmonic OLED may be a stacked structure that includes multiple OLED structures within it. For example, the non-plasmonic OLED structure shown in FIG. 4A includes two non-plasmonic OLEDs arranged in a stack. The first is defined by outer electrodes 330, 340, with an emissive layer 335 disposed between them. A second non-plasmonic OLED is defined by outer conductive layers 320, 330, with emissive layer 322 disposed between them. Each non-plasmonic OLED may include any or all of the other layers disclosed with respect to FIGS. 1 and 2 or, more generally, any layer or structure suitable for use in an OLED as known in the art. As shown in FIG. 4A, plasmonic and non-plasmonic OLEDs disclosed herein may use electrodes 310, 340 that provide external electrical connections, or they may use charge generation layers 320, 330 to provide electrode-like functionality, as is known in the art. A plasmonic OLED 350 may include one or more electrodes or equivalent layers 310, 320, with one or more emissive layers 315 disposed between them. The plasmonic and non-plasmonic OLEDs may be arranged in a stack over a substrate (not shown). As used herein, two devices, layers, or other components may be arranged "in a stack" or in a "stacked" configuration where one is disposed at least partly over the other relative to a substrate or other common layer. In contrast to a stacked configuration, two components may be described as being arranged in a plane or in a side-by-side configuration where there is no overlap of the components along any and all vertical lines drawn through one of the components.

More generally, arrangements disclosed herein may include one or more plasmonic OLEDs and zero or more non-plasmonic OLEDs incorporated into a common display architecture. As previously disclosed, a plasmonic OLED includes an enhancement layer. In the example structure shown in FIG. 4A, the cathode 310 acts as both an electrical contact as well as the enhancement layer for the plasmonic OLED 350. Light emitted by emissive layers in one or more non-plasmonic OLEDs 360, such as EMLs 322, 335, may be transmitted by the plasmonic OLED 360 and an outcoupling structure 305, if present, as disclosed in further detail herein.

Figure 4B:
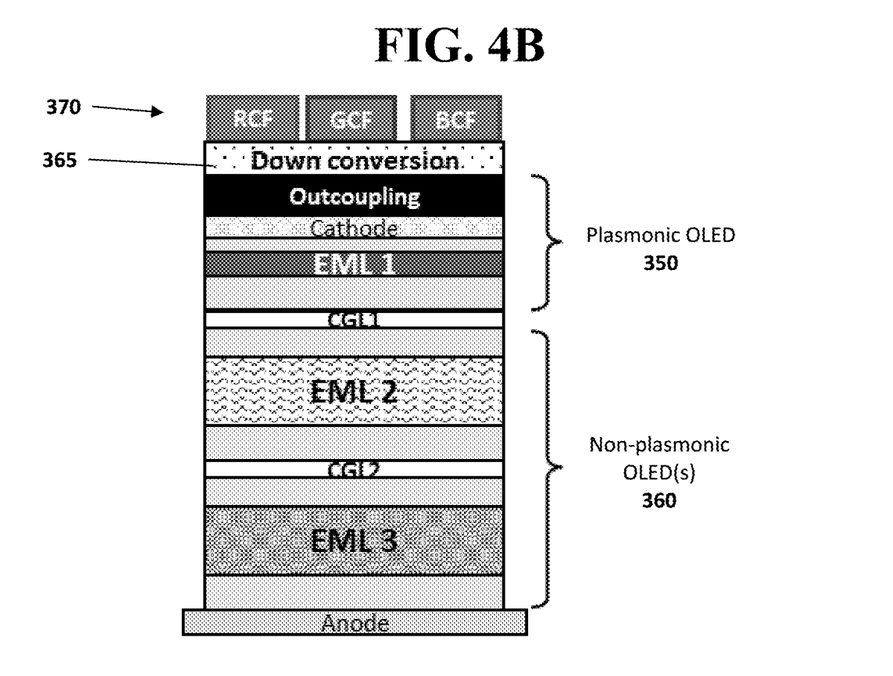
FIG. 4B shows the OLED architecture from FIG. 4A including down conversion layers, and color filters.

Devices disclosed herein may include additional structures that operate in conjunction with the plasmonic and/or non-plasmonic OLEDs. For example, FIG. 4B shows the same device as FIG. 4A with a down conversion layer 365 and red, green, and blue color filters 370. The down conversion layers can include fluorescent emitters, inorganic phosphors, organic phosphors, quantum dots, or any other element which absorbs photons and re-emits photons at lower energy. A device as shown in FIG. 4B may include a down conversion layer that is uniformly deposited over all sub-pixels as shown, or it may be patterned over one or more sub-pixels. For example, where one or more of the OLEDs emits blue light, red and green down conversion and/or color filter layers may be disposed over the red and green sub-pixels, while a blue sub-pixel uses only the unfiltered light provided by the blue emissive devices. When such a layer is patterned over one or more sub-pixels, its composition may vary between sub-pixels. Various configurations may use any number of color filters in addition to the down conversion layer, or the down conversion layer may be used without associated color filters. Each sub-pixel may have a different configuration, such that each may include a down conversion layer and/or a color filter regardless of the structure used for other sub-pixels, in any combination.

Figure 4C:
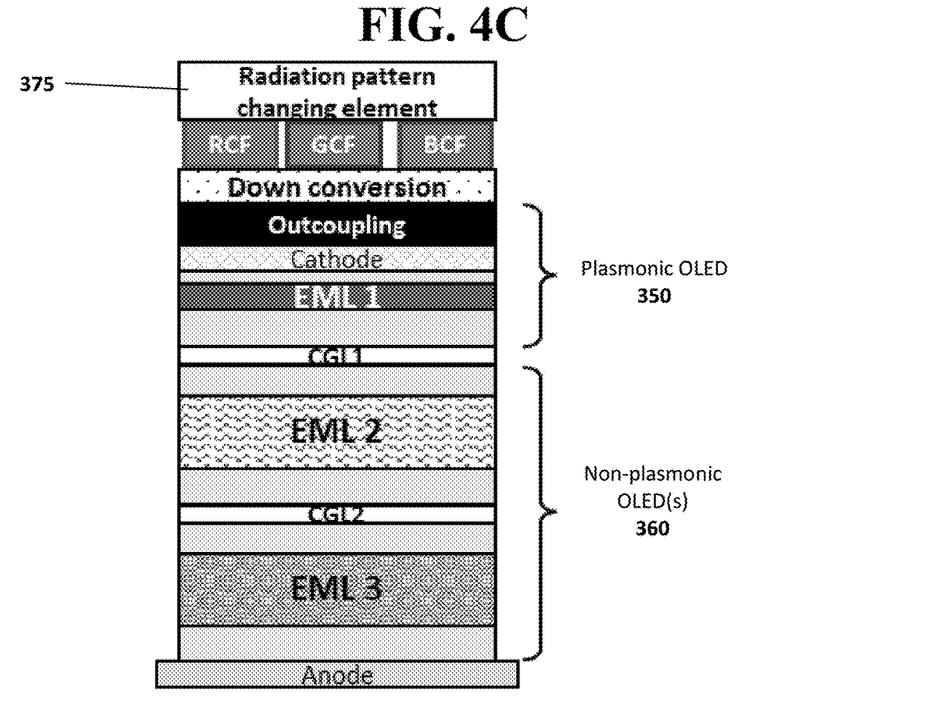
FIG. 4C shows the same architecture as FIG. 4B with an additional element which modifies the radiation pattern of the sub-pixels in the device.

As another example, devices disclosed herein may include a radiation pattern changing element. FIG. 4C shows the same device as in FIG. 4B with the addition of a radiation pattern changing element to modify the angular dependence of the display. As with the down conversion and color filter components, the radiation pattern changing element 375 may be uniformly deposited over the display or patterned over one or more sub-pixels, individually or concurrently. The radiation pattern modifying element composition does not have to be the same over all the sub-pixels, and may vary between pixels or between stacked OLED devices within a single display panel. Further, the radiation pattern modifying element may be used to convert the radiation pattern from non-Lambertian to Lambertian, or from Lambertian to non-Lambertian for applications where a certain angular dependence is desired. For example, the element 375 may include a nanopatch antenna out-coupling mechanism to convert the plasmon energy into photons, which results in a near-Lambertian emission profile. In certain mobile display applications where some angular dependence is desired, the radiation pattern modifying element may be used to form a cavity atop the plasmon out-coupling mechanism. The element may include, for example, a semi-transparent metal or a distributed Bragg reflector to establish the desired cavity effect. The element 375 may be used alone or in conjunction with one or more of the components described with respect to FIG. 4B, in any combination.

Figure 4D:
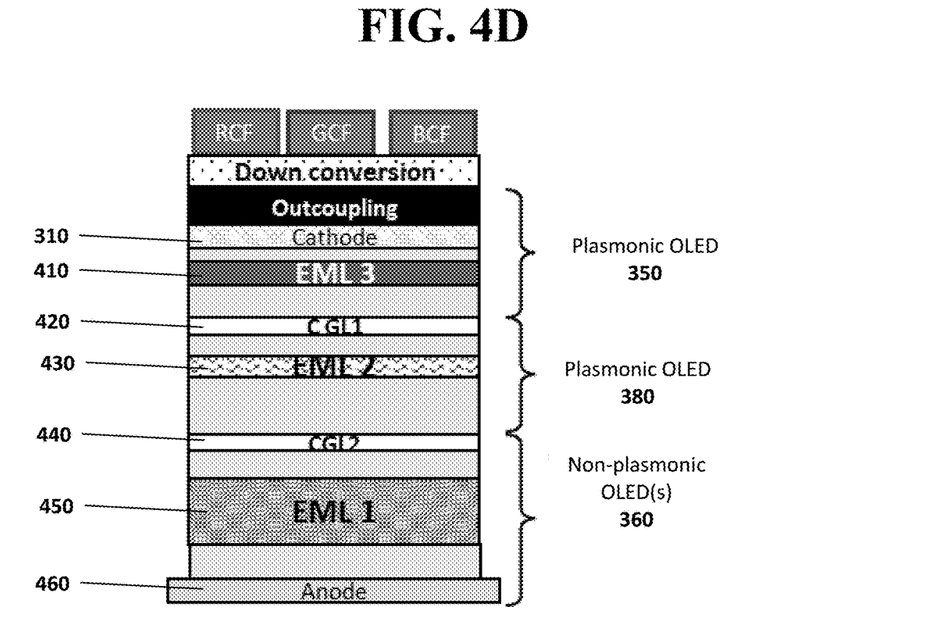
FIG. 4D shows an example architecture with multiple plasmonic OLED devices incorporated into the device stack that will render the sub-pixels for a display.

As previously disclosed, one or more plasmonic OLEDs may be arranged in a stack with zero or more non-plasmonic OLEDs. FIG. 4D shows a schematic depiction of a device that includes two plasmonic OLED devices 350, 380 arranged in a stack with a non-plasmonic OLED 360. As shown the device may include electrodes and charge generation layers that define the boundaries of each OLED in the stack. In this example, the cathode 310 acts as an enhancement layer for the emissive layer 410 in the first plasmonic OLED 350, and a charge generation layer 420 acts as an enhancement layer and outcoupling layer for the emissive layer 430 in the second plasmonic OLED 380 as well as a CGL for the device stack. The example shown in FIG. 4D includes a down conversion layer and color filters as previously disclosed as an example, but more generally zero or more down conversion layers color filters, outcoupling components, and/or radiation pattern changing elements may be used as previously disclosed.

In some cases a plasmonic OLED 380 may have a lower efficiency compared to other plasmonic OLEDs in different stack structures. This may occur when light outcoupled from the non-plasmonic OLED 360 needs to pass through either the charge generation layer 440 and the anode 460 for a bottom-emitting device, or through the cathode 310 for a top-emitting device. The transmission of these layers is likely lower than 100%, thus lowering the efficiency of the plasmonic OLED 380 formed with EML2 430.

In some cases it may be desirable to use plasmonic OLEDs that have emission spectra that have a large spectral width. Such devices can render a display with multiple sub-pixels directly. Examples of devices that include structures with combinations of plasmonic OLEDs that can render multiple sub-pixels and non-plasmonic OLEDs are schematically shown in FIGS. 5A-5C.

Figure 5A:
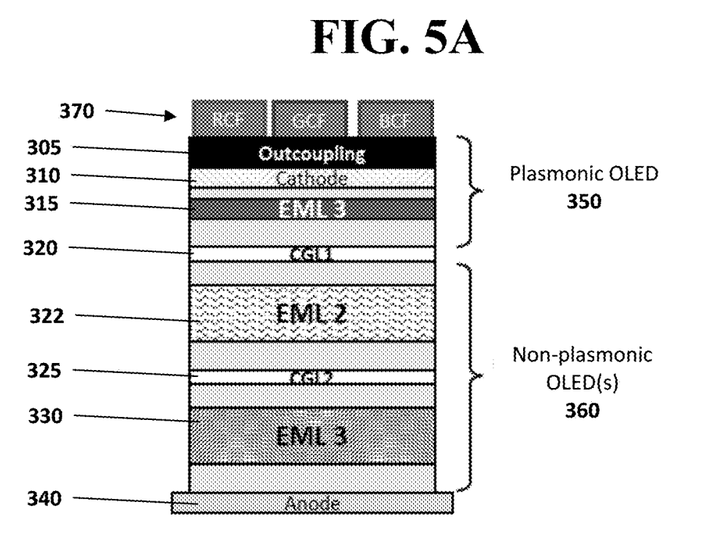
FIG. 5A shows a device in which broadband emission from the plasmonic OLED is outcoupled as broad band light by the outcoupling layer and then converted to individual sub-pixels by color filters.
Figure 5B:
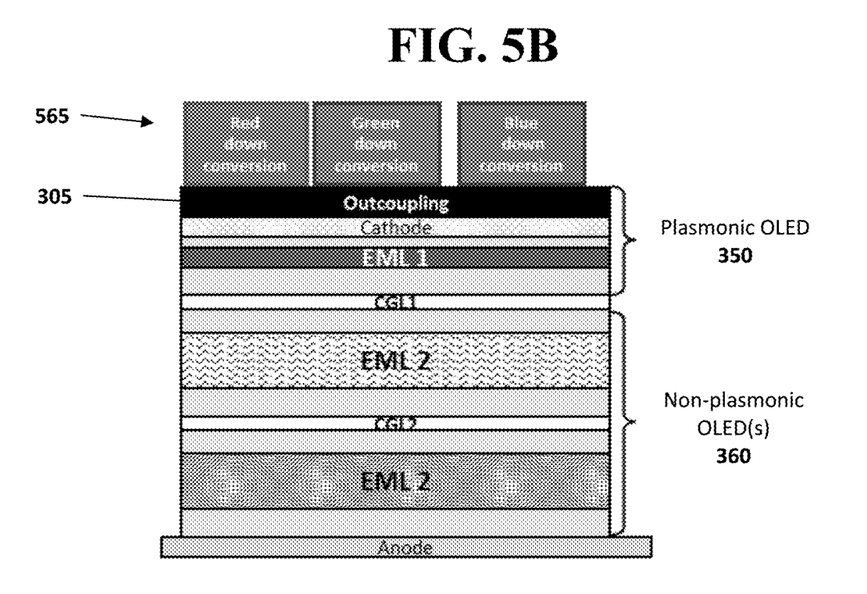
FIG. 5B shows a device having broadband emission from the plasmonic OLED that is outcoupled as broad band light by the outcoupling layer and then converted to sub-pixel colors via down conversion layers.
Figure 5C:
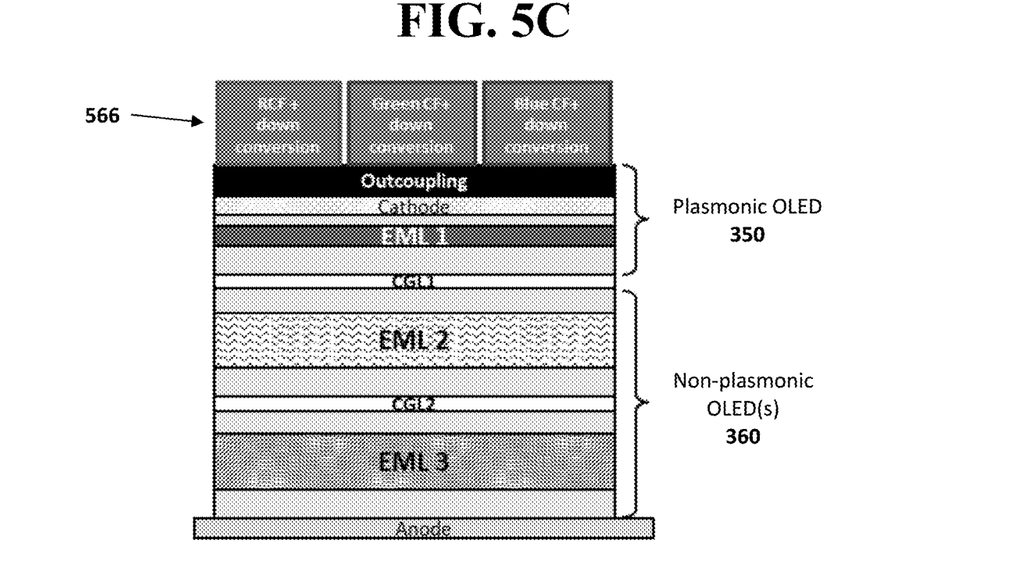
FIG. 5C shows a device having broadband emission from the plasmonic OLED that is outcoupled as broad band light by the outcoupling layer and then converted to individual sub-pixel colors by down conversion layers and color filters.

FIG. 5A shows an example device structure that includes one plasmonic OLED and two non-plasmonic OLEDs, much like the structures described with respect to FIGS. 4A-4C. The plasmonic OLDD may include a phosphorescent or other emissive layer 315, which may include one or more emissive materials that emit multi-colored light. The light emitted by the plasmonic EML 315 in the OLED 350 may be converted to provide two or more sub-pixels, such as by using a layer of one or more color filters 370. As previously disclosed, although FIG. 5A shows two non-plasmonic OLEDs 360 for illustration purposes, more generally a device as shown in FIG. 5A may include zero or more non-plasmonic OLEDs. The conversion of light from the plasmonic OLEDs having a relatively large spectral width may be accomplished by, for example, a broad band outcoupling structure in which the outcoupled emission is then converted to spectrally-pure colors by one or more color filters, down-conversion layers, or a combination, such as previously disclosed and as shown in FIGS. 5A-5C. For example, FIG. 5B shows an arrangement in which a single outcoupling layer 305 is used to outcouple light generated in the plasmonic OLED 350, but individual down conversion layers 565 are used to generate red, green, and blue light from corresponding sub-pixels. FIG. 5C shows the same device, where individual sub-pixels include combined color filter and down conversion components 566. Such components may be provided in a single layer with the components being arranged side by side, or they may be provided in two or more separate layers. In some embodiments color filters or down conversion layers may include an additional coating, or an additional layer or component may be used, to change the radiation pattern as previously disclosed.

Figure 5D:
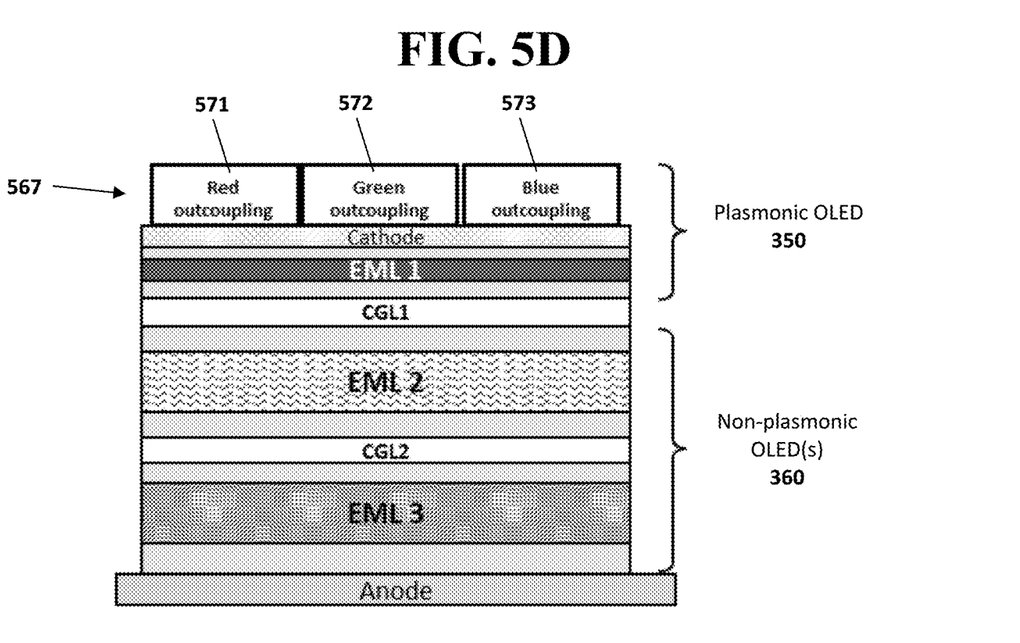
FIG. 5D shows a device having broadband emission from the plasmonic OLED that is outcoupled as R, G, and B layer by compositionally different outcoupling layers to generate individual sub-pixel colors.

In some configurations, sub-pixel colors may be rendered by outcoupling specific spectral regions. For example, a white-emitting plasmonic OLED may be outcoupled into red, green, and blue sub-pixels by using a fixed-pitch grating through changing the refractive index of the material coating the grating such that the dispersion relation preferentially scatters red, green, or blue light normal to the substrate. A schematic depiction of such an embodiment is shown in FIG. 5D. In this arrangement, the composition of the outcoupling layer 567 may be different for each sub-pixel, such that the red, green, and blue sub-pixels are defined by the corresponding outcoupling layers 571, 572, 573, respectively. In some embodiments, the difference between the outcoupling components and/or materials could be small. For example, all outcoupling layers may have a 300 nm pitch grating with the blue sub-pixel outcoupling layer 573 having no coating, while the red outcoupling layer 571 may have a 1 micrometer thick coating of a material with a refractive index of 1.7. Other example outcoupling mechanisms for selecting specific wavelength ranges include, but are not limited to, nanopatch antennas or other nanoparticle-based outcoupling schemes, and through-hole arrays.

In some configurations, it may be desirable to use specific materials or combinations of materials to achieve specific effects. For example, it may be desirable to balance charge distribution and injection within a plasmonic OLED, and specifically for a phosphorescent plasmonic OLED. One way to avoid a large charge increase when switching the plasmonic enhancement layer from Al to Ag or other more plasmonically active materials, is to use an electron injection layer such as Yb or an alloy or oxide thereof, which works with common plasmonically-active materials such as Mg and Ag. Alternatively or in addition, adhesion layers may be used that also act as charge injection layers, such as Mg. Al. Ni. and Ti layers. As a specific example, a 10 angstrom layer of Al in conjunction with a layer of Ag may be used. It may be preferred for adhesion layers to be between 2 and 60 angstroms thick; more preferably between 5 and 30 angstroms, or more preferably between 5 and 20 angstroms.

It also may be desirable to balance charge within the device, because even in devices that are stabilized by coupling to the plasmon mode of a metal, if charge balance is lost the lifetime of the device may be reduced. Various techniques may be used to maintain a desirable charge balance, including using a lower electron mobility electron transport layer, such as AlQ3. As another example, the thickness of a hole blocking layer may be increased to reduce the speed of electron injection from an electron transport layer to an emissive layer. As another example, a hole blocking material with a relatively higher LUMO may be used to add an electron injection barrier or within the emissive layer to reduce electron injection and/or mobility in the emissive layer. Alternatively or in addition, a higher-HOMO electron blocking material may be used to reduce the hole injection barrier into the emissive layer. As another example, the proportion of e-type host within the emissive layer may be reduced to lower electron mobility within the emissive layer. As another example, a relatively thin hole transport layer may be used and/or the percentage of emissive material in a doped EML may be increased to increase hole mobility within the device. It also may be desirable to maintain a high-quality enhancement layer to improve the performance of the plasmonic OLED. Specific examples include Ag films having growth rates of 0.1 to 10 Å/s, more preferably 0.5 to 2.5 Å/s. Any or all of these approaches may be used individually or in conjunction with any other approaches to achieve a stable, efficient plasmonic OLED.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
   a first organic light emitting diode (OLED) stack, the first OLED stack comprising:
      a first electrode;
      a first charge generation layer; and
      a first organic emissive layer disposed between the first electrode and the first charge generation layer and within a first threshold distance of the first electrode or the first charge generation layer, the first organic emissive layer comprising a first organic emissive material, wherein the first threshold distance is the distance at which a total non-radiative decay rate constant of the first organic emissive material is equal to a total radiative decay rate constant of the first organic emissive material;
   a second OLED stack, the second OLED stack comprising:
      the first charge generation layer;
      a second charge generation layer; and
      a second organic emissive layer disposed between the first charge generation layer and the second charge generation layer; and a third OLED stack, the third OLED stack comprising:
  the second charge generation layer;
  a second electrode; and
  a third organic emissive layer disposed between the second charge generation layer and the second electrode; and
wherein the first organic emissive layer is disposed over the second organic emissive layer and wherein the second organic emissive layer is disposed over the third organic emissive layer.

2. The device of claim 1, further comprising at least one component selected from the group consisting of: a color filter, a down conversion layer, an up conversion layer, and a radiation pattern modifying element.

3. The device of claim 1, wherein the first organic emissive material comprises a blue emissive material.

4. The device of claim 1, wherein the second organic emissive layer is within a second threshold distance of the first charge generation layer or the second charge generation layer, the second organic emissive layer comprising a second organic emissive material, wherein the second threshold distance is the distance at which a total non-radiative decay rate constant of the second organic emissive material is equal to a total radiative decay rate constant of the second organic emissive material.

5. The device of claim 4, wherein the second organic emissive material is the first organic emissive material.

6. The device of claim 4, further comprising at least one component selected from the group consisting of: a color filter, a down conversion layer, an up conversion layer, and a radiation pattern modifying element.

7. The device of claim 4, wherein the second organic emissive material comprises a blue emissive material.

8. The device of claim 1, wherein the third emissive layer is within a third threshold distance of the second charge generation layer or the second electrode, the third organic emissive layer comprising a third organic emissive material, wherein the third threshold distance is the distance at which a total non-radiative decay rate constant of the third organic emissive material is equal to a total radiative decay rate constant of the third organic emissive material.

9. The device of claim 8, wherein the third organic emissive material is the first organic emissive material.

10. The device of claim 8, further comprising at least one component selected from the group consisting of: a color filter, a down conversion layer, an up conversion layer, and a radiation pattern modifying element.

11. The device of claim 8, wherein the third organic emissive material comprises a blue emissive material.

12. A device comprising:
a first organic light emitting diode (OLED) stack, the first OLED stack comprising:
  a first electrode;
  a first charge generation layer; and
  a first organic emissive layer disposed between the first electrode and the first charge generation layer;
a second OLED stack, the second OLED stack comprising:
  the first charge generation layer;
  a second charge generation layer; and
  a second organic emissive layer disposed between the first charge generation layer and the second charge generation layer; and
a third OLED stack, the third OLED stack comprising:
  the second charge generation layer;
  a second electrode; and
  a third organic emissive layer disposed between the second charge generation layer and the second electrode and within a first threshold distance of the second electrode or the second charge generation layer, the third organic emissive layer comprising a third organic emissive material, wherein the first threshold distance is the distance at which a total non-radiative decay rate constant of the third organic emissive material is equal to a total radiative decay rate constant of the third organic emissive material; and
wherein the first organic emissive layer is disposed over the second organic emissive layer and wherein the second organic emissive layer is disposed over the third organic emissive layer.

13. The device of claim 12, further comprising at least one component selected from the group consisting of: a color filter, a down conversion layer, an up conversion layer, and a radiation pattern modifying element.

14. The device of claim 12, wherein the third organic emissive material comprises a blue emissive material.

15. A device comprising:
a first organic light emitting diode (OLED) stack, the first OLED stack comprising:
  a first electrode;
  a first charge generation layer; and
  a first organic emissive layer disposed between the first electrode and the first charge generation layer;
a second OLED stack, the second OLED stack comprising:
  the first charge generation layer;
  a second charge generation layer; and
  a second organic emissive layer disposed between the first charge generation layer and the second charge generation layer and within a first threshold distance of the first charge generation layer or the second charge generation layer, the second organic emissive layer comprising a second organic emissive material, wherein the first threshold distance is the distance at which a total non-radiative decay rate constant of the second organic emissive material is equal to a total radiative decay rate constant of the second organic emissive material; and
a third OLED stack, the third OLED stack comprising:
  the second charge generation layer;
  a second electrode; and
  a third organic emissive layer disposed between the second charge generation layer; and
wherein the first organic emissive layer is disposed over the second organic emissive layer and wherein the second organic emissive layer is disposed over the third organic emissive layer.

16. The device of claim 15, further comprising at least one component selected from the group consisting of: a color filter, a down conversion layer, an up conversion layer, and a radiation pattern modifying element.

17. The device of claim 15, wherein the second organic emissive material comprises a blue emissive material.

18. The device of claim 15, wherein the third emissive layer is within a second threshold distance of the second charge generation layer or the second electrode, the third organic emissive layer comprising a third organic emissive material, wherein the second threshold distance is the distance at which a total non-radiative decay rate constant of the third organic emissive material is equal to a total radiative decay rate constant of the third organic emissive material.

19. The device of claim 18, wherein the third organic emissive material is the second organic emissive material.

20. The device of claim 18, further comprising at least one component selected from the group consisting of: a color filter, a down conversion layer, an up conversion layer, and a radiation pattern modifying element.

21. The device of claim 18, wherein third second organic emissive material comprises a blue emissive material.

* * * * *